(12) United States Patent
Takahashi

(10) Patent No.: US 6,724,268 B2
(45) Date of Patent: Apr. 20, 2004

(54) VARIABLE DELAY CIRCUIT, AND DIFFERENTIAL VOLTAGE-CONTROLLED RING OSCILLATOR USING THE SAME, AND PLL USING THE OSCILLATOR

(75) Inventor: Michiru Takahashi, Aichi-ken (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/323,725

(22) Filed: Dec. 20, 2002

(65) Prior Publication Data

US 2003/0122627 A1 Jul. 3, 2003

(30) Foreign Application Priority Data

Dec. 21, 2001 (JP) ........................ 2001-389829
Oct. 15, 2002 (JP) ........................ 2002-300512

(51) Int. Cl.$^7$ ................................ H03B 5/24
(52) U.S. Cl. ........................ 331/57; 327/278
(58) Field of Search ........................ 331/57; 327/277, 327/278, 281, 272

(56) References Cited

U.S. PATENT DOCUMENTS

| 5,418,499 | A |   | 5/1995  | Nakao ........................ 331/57 |
|-----------|---|---|---------|--------------------------------------|
| 6,137,668 | A | * | 10/2000 | Feldtkeller ................. 361/103 |
| 6,191,630 | B1| * | 2/2001  | Ozawa et al. ................ 327/278 |
| 6,373,342 | B1| * | 4/2002  | Tran ........................ 331/57  |
| 6,404,258 | B2| * | 6/2002  | Ooishi ...................... 327/278 |
| 2001/0045856 | A1 | * | 11/2001 | Ooishi ................... 327/277 |

FOREIGN PATENT DOCUMENTS

| JP | 61-12117   | 1/1986 |
| JP | 5-191221   | 7/1993 |
| JP | 7-74596    | 3/1995 |
| JP | 10-200382  | 7/1998 |

* cited by examiner

Primary Examiner—Robert Pascal
Assistant Examiner—Joseph Chang
(74) Attorney, Agent, or Firm—Posz & Bethards, PLC

(57) ABSTRACT

An inventive voltage-controlled ring oscillator provides a relatively stable oscillation frequency even with a lower power supply voltage. The oscillator includes an odd number of inverters and a variable delay circuit connected in a ring. The variable delay circuit comprises first and second control terminals to which first and second control signals that determine the amount of delay are applied; and a switching circuit including a first and second switching elements each comprising a MOS transistor. The variable delay circuit further includes an off control circuit, responsive to an input signal from the inverter portion, for turning off one of the first and second switching elements by shorting a gate-source path of the one switching element; and a current control circuit, responsive to an off state of the second switching element, for causing the first control signal to control a first current flowing through the first switching element by providing a conductive path between the first control terminal and a gate of the first switching element, and responsive to an off state of the first switching element, for causing the second control signal to control a second current flowing through the second switching element by providing a conductive path between the second control terminal and a gate of the second switching element.

18 Claims, 10 Drawing Sheets

VARIABLE DELAY CIRCUIT, AND DIFFERENTIAL VOLTAGE-CONTROLLED RING OSCILLATOR USING THE SAME, AND PLL USING THE OSCILLATOR

BACKGROUND OF THE INVENTION

1. Field of the Invention

The invention relates to a phase locked loop (PLL) suited for portable electronic devices and more specifically to a differential voltage-controlled delay circuit usable in a differential voltage-controlled oscillator for use in such PLLs.

2. Description of the Prior Art

Ring oscillators have come to attract engineer's attentions as the voltage-controlled oscillator (VCO) for use in PLLs. This is because ring oscillators have a wider oscillation range covering a GHz order and are suitable for monolithic integration, which enables a reduction in the size of integrated circuit (IC) chip.

As the degree of integration becomes higher, IC patterns are further miniaturized, which lowers the withstand voltages of circuit elements constituting the IC. For this reason, desired is ring oscillators and PLLs that can operate with a lower power supply voltage. Also, in order that ring oscillators or PLLs can be used in portable electronic devices, which are usually provided with a lower power battery, it is preferable that ring oscillators are low in power consumption.

FIG. 1 is a circuit diagram showing an exemplary arrangement of a typical voltage-controlled ring oscillator disclosed in U.S. Pat. No. 5,418,499. In FIG. 1, the ring oscillator 102 is constituted by connecting an odd number of (3 in this specific example) variable-delay inverters 120-1, 120-2 and 120-3 in the form of a ring. Each variable-delay inverter 120-$i$ ($i$=1, 2, 3) comprises p-channel MOS FETs (metal oxide semiconductor field-effect transistors) (referred to as "pMOS transistors") TP2 and TP1 and n-channel MOS FETs (referred to as "nMOS transistors") TN1 and TN2 serially-connected (so-called totem pole-connected) between a power supply line L1 and a ground line L2.

The pMOS transistor TP1 and the nMOS transistor TN1 of which the gates and the drains are connected together to form a CMOS (complementary MOS) inverter are referred to as "switch elements TP1 and TN1", respectively. The pMOS transistor TP2 and the nMOS transistor TN2 are referred to as "current-control elements TP2 and TN2", respectively.

The input and output terminals of the CMOS inverter comprised of the switch elements TP1 and TN1 serve as the input and the output terminals of each variable-delay inverter 120-$i$. A first control voltage Vc1 is applied in common to the current-control element TP2 of each inverter 120-$i$, and a second control voltage Vc2 is applied in common to the current-control element TN2 of each inverter 120-$i$.

FIG. 2 is a diagram showing an equivalent circuit of a variable-delay inverter 120-$i$ to illustrating the operational principle of the voltage-controlled ring oscillator 102. In FIG. 2, the equivalent circuit comprises a one-stage variable-delay inverter 120-$i$ and an equivalent capacitor Cin inserted between the output terminal Vo of the inverter 120-$i$ and the ground line VG and equivalent to the input capacitance of the next stage variable-delay inverter 120.

First, it is assumed that the two current-control elements TP2 and TN2 are completely on having the ground voltage VG applied as the first control voltage Vc1 and the power voltage VD applied as the second control voltage Vc2. Then, if the input Vi of the variable-delay inverter 120 is high or at the power supply voltage VD, the switch element TP1 is off and the switch element TN1 are on resulting in the output of the variable-delay inverter 120 being low or at the ground voltage VG.

In this state, if the input voltage Vi changes from the high level to the low level, then the switch element TP1 turning on and the switch element TN1 turning off causes the equivalent capacitor Cin to be charged through the current-control element TP2 and the switch element TP1, which results in the high level of the output voltage Vo. The charge current in this case is controlled by the current-control element TP2 and the first control voltage Vc1.

In this state, if the input voltage Vi changes from the low level to the high level, then the switch element TP1 turning off and the switch element TN1 turning on causes the equivalent capacitor Cin to be discharged through the switch element TN1 and the current-control element TN2, which results in the low level of the output voltage Vo. The discharge current in this case is controlled by the current-control element TN2 and the second control voltage Vc2.

More specifically, as shown in FIG. 3, if the input voltage Vi changes from the high level to the low level at time t1, then, with a certain delay after the input voltage Vi change, the output voltage Vo begins to change (rise in this case) at time t2. In this case, the larger the first control voltage Vc1 is, the smaller the gate-source voltage of the current-control element TP2, resulting in a smaller charging current. Thus, as the first control voltage Vc1 increases in magnitude, the change in the output voltage Vo or the waveform of voltage across the equivalent capacitor Cin varies as shown by waveforms labeled "a", "b" and "c".

Similarly, if the input voltage Vi changes from the low level to the high level at time t3, then, with a certain delay after the input voltage Vi change, the output voltage Vo begins to change (fall in this case) at time t4. In this case, the smaller the second control voltage Vc2 is, the smaller the gate-source voltage of the current-control element TN2, resulting in a smaller charging current. Thus, as the second control voltage Vc2 decreases in magnitude, the change in the output voltage Vo or the waveform of voltage across the equivalent capacitor Cin varies as shown by waveforms labeled "d", "e" and "f".

That is, with a larger first control voltage Vc1 and/or a smaller second control voltage Vc2, it takes the longer delay time for the output voltage to reach a threshold level to turn to the inverted level after the inversion of the input voltage Vi level.

Thus, in each variable-delay inverter 120-$i$, the rising characteristic of the output voltage Vo varies depending on the first control voltage Vc1, and the falling characteristic of the output voltage Vo varies depending on the second control voltage Vc2, which causes a change in the propagation delay of each variable-delay inverter 120-$i$ and accordingly in the oscillation frequency of the ring oscillator 102.

However, in the above-described voltage-controlled ring oscillator 102, a lowering of the power supply voltage VD decreases the charging and discharging currents that flow during a period of inversion of the output voltage, which lowers the oscillation frequency. If the power supply voltage VD becomes too low to keep the gate-source voltages at a level necessary for turning on the switch elements TP1 and TN1 and the current-control elements TP2 and TN2, then the voltage-controlled ring oscillator 102 ceases oscillation.

Also, in the above-described ring oscillator 102, which includes four serially connected transistors, two of the four transistors have to be turned on at a time. In order to maintain an enough gate-source voltage, the power supply voltage cannot be lowered so much.

One of the solutions to this problem is provided by Japanese unexamined patent publication No. Hei10-200382 entitled "Voltage Controlled Oscillator Circuit for Low Voltage Driving". This voltage controlled oscillator circuit comprises a ring oscillator portion consisting of three 2-transistor inverters and an oscillation frequency controller for providing a power supply voltage to the ring oscillator portion. That is, the oscillation frequency is controlled by controlling the power supply voltage to the ring oscillator portion. Since the parasitic capacitance of the MOS FET gate is on the order of several to tens fF (femtofarad), if it is assumed that the gate capacitance is 10 fF, the oscillation frequency controller output (i.e., the power supply voltage to the ring oscillator portion) is 1.8 V and the oscillation frequency is 500 MHz, then the gate current of each transistor is 10 (fF)×500·10$^6$ (Hz)×1.8 (V)=9 μA, which means that each inverter needs a current of mA order. In order to provide a stable power supply voltage while supplying a current (more than mA order) enough to drive the ring oscillator portion, the oscillation frequency controller has to keep the inner current level more than a predetermined value. Thus, though the voltage controlled oscillator circuit enables the low voltage driving, it is not effective in reduction of the power consumption.

Also, to the problem of lowering the power supply voltage while securing the necessary gate-source voltage, it is another solution to set the threshold value of the MOS FETs constituting the ring oscillator 102 to a lower value. However, in the MOS FET, if the threshold value were set lower, then the leak current would increase in magnitude. This makes it difficult to reduce the power consumption.

What is needed is a voltage-controlled ring oscillator which is relatively small in a lowering of oscillation frequency due to the lowering of the power supply voltage and which can operate with a lower power supply voltage without increasing the leak current of the constituent MOS FETs.

What is needed is a PLL, a clock recovery circuit and a frequency synthesizer that use a voltage-controlled ring oscillator which is relatively small in a lowering of oscillation frequency due to the lowering of the power supply voltage and which can operate with a lower power supply voltage without increasing the leak current of the constituent MOS FETs.

SUMMARY OF THE INVENTION

According to an aspect of the invention, a variable delay circuit for providing a delayed version of an input signal is provided. The variable delay circuit is preferably connected to an input of a load which input has a capacitance. The variable delay circuit comprises an input terminal to which the input signal is applied; an output terminal to be connected to the input of the load; first and second control terminals to which first and second control signals that determine the amount of delay are applied; and a switching circuit. The switching circuit includes a first switching element comprising a p-channel MOS transistor having its drain connected to the output terminal and its source connected to a higher power supply conductor; and a second switching element comprising an n-channel MOS transistor having its drain connected to the output terminal and its source connected to a lower power supply conductor. The variable delay circuit further includes an off control circuit, responsive to the input signal, for turning off one of the first and second switching elements by shorting a gate-source path of the one switching element; and a current control circuit, responsive to an off state of the second switching element, for causing the first control signal to control a first current flowing through the first switching element by providing a conductive path between the first control terminal and a gate of the first switching element, and responsive to an off state of the first switching element, for causing the second control signal to control a second current flowing through the second switching element by providing a conductive path between the second control terminal and a gate of the second switching element.

According to another aspect of the invention, an integrated circuit including the load and the above-described variable delay circuit is provided. The load and the variable delay circuit are disposed along a first direction. Along the first direction, there are disposed: a first block in which the first off control element and the first current control element are disposed along a second direction perpendicular to the first direction; and a second block in which the second off control element and the second current control element are disposed along the second direction. The first and second switching elements are disposed in respective areas, lying along the second direction, between which the first block and the second block are disposed.

According to further aspect of the invention, a voltage-controlled ring oscillator using the above-described variable delay circuit is provided. The voltage-controlled ring oscillator includes an odd number of inverter circuits as the load. The output of the load is connected to the input terminal. The voltage-controlled ring oscillator oscillates at a frequency responsive to the first and second control signals.

According to further aspect of the invention, a phase locked loop (PLL) circuit using the above-described voltage-controlled ring oscillator is provided. The PLL circuit includes a control circuit for generating the first and second control signals on the basis of a phase difference between a reference signal given from external and a divide-by-N signal into which an output signal from the voltage-controlled ring oscillator is divided by N, where N is an integer including 1.

BRIEF DESCRIPTION OF THE DRAWING

Further objects and advantages of the present invention will be apparent from the following description of the preferred embodiments of the invention as illustrated in the accompanying drawing, in which.

Throughout the drawing, the same elements when shown in more than one figure are designated by the same reference numerals.

DETAILED DESCRIPTION OF THE PREFERRED EMBODIMENTS

Figure 4:
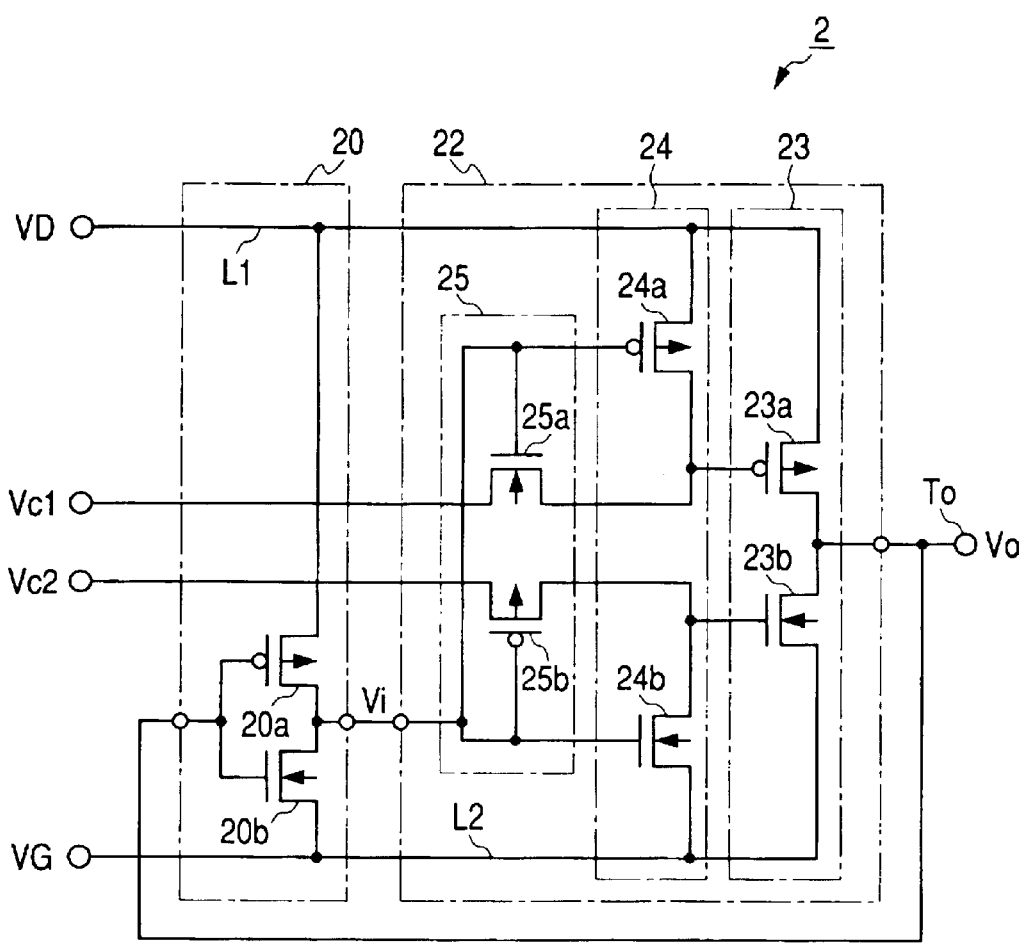
FIG. 4 is a schematic circuit diagram of a differential voltage-controlled ring oscillator according to an aspect of the invention.

FIG. 4 is a schematic circuit diagram conceptually showing an exemplary arrangement of a differential voltage-controlled ring oscillator according to an aspect of the invention. In FIG. 4, the differential voltage-controlled ring oscillator 2 comprises an inverter circuit 20 for outputting an inverted version Vi of the input signal Vo thereto; and a variable delay circuit 22 for outputting a delayed version Vo of the input signal Vi thereto with a capability of changing the amount of delay in response to a first control voltage Vc1 and a second control voltage Vc2. The output Vi of the inverter 20 is coupled with the input of the delay circuit 22 and the output Vo of the delay circuit 22 is coupled with the input of the inverter 20 thereby to form a ring circuit. The output of the variable delay circuit 22 is connected to an output terminal To of the voltage-controlled ring oscillator 2.

The inverter 20 is comprised of a CMOS inverter that comprises a p-cannel MOS FET (referred to as "pMOS") 20a and an n-channel MOS FET (referred to as "nMOS") 20b of which the gates are connected together and of which the drains are connected together. The source of the pMOS transistor 20a is connected to the power supply line L1, and the source of the nMOS transistor 20b is connected to the ground line L2.

On the other hand, the variable delay circuit 22 is provided with a switching circuit 23 that comprises a pMOS transistor (referred to as "first switch element") 23a and an nMOS transistor (referred to as "second switch element") 23b of which the drains are connected together. The source of the first switch element 23a is connected to the power supply line L1, and the source of the second switch element 23b is connected to the ground line L2.

The variable delay circuit 22 is further provided with an off-control circuit 24 that comprises a pMOS transistor (referred to as "first off-control element") 24a and an nMOS transistor (referred to as "second off-control element") 24b. The first off-control element 24a has its source connected to the power supply line L1, its drain connected to the gate of the first switch element 23a, and its gate connected to the input (Vi) terminal of the variable delay circuit 22. The second off-control element 24b has its source connected to the ground line L2, its drain connected to the gate of the second switch element 23b, and its gate connected to the input (Vi) terminal of the variable delay circuit 22.

Also, the variable delay circuit 22 is provided with a current controller 25 that comprises an nMOS transistor (referred to as "first current-control element") 25a and a pMOS transistor (referred to as "second current-control element") 25b. The first current-control element 25a has its gate connected, together with the first off-control element 24a gate, to the input Vi terminal of this variable delay circuit 22, and connects and disconnects the first control terminal to which the first control voltage Vc1 is applied to and from the gate of the first switch element 23a, respectively, in response to the input signal Vi from the input terminal. The second current-control element 25b has its gate connected, together with the second off-control element 24b gate, to the input Vi terminal of this variable delay circuit 22, and connects and disconnects the second control terminal to which the second control voltage Vc2 is applied to and from the gate of the second switch element 23b, respectively, in response to the input signal Vi from the input terminal.

In thus configured variable delay circuit 22, if the input Vi is at the low level or the ground level VG, then the first off-control element 24a and the second current-control element 25b are on, and the first current-control element 25a and the second off-control element 24b are off. This causes the first switch element 23a that has the power supply voltage VD supplied to its gate and source to be off, and also causes the second switch element 23b that has the second control voltage Vc2 from the second control terminal applied to its gate to be on. Thus, the output voltage Vo of the variable delay circuit 22 is at the low level or the ground voltage VG.

On the other hand, if the input Vi is at the high level or the power supply voltage VD, then the first off-control element 24a and the second current-control element 25b are off, and the first current-control element 25a and the second off-control element 24b are on. This causes the first switch element 23a that has the first control voltage Vc1 supplied to its gate from the first control terminal to be on, and also causes the second switch element 23b that has the ground voltage VG applied to its gate and source to be off. Thus, the output voltage Vo of the variable delay circuit 22 is at the high level or the power supply voltage VD.

The operation of the voltage-controlled ring oscillator 2 is described in the following.

When the output voltage Vo of the variable delay circuit 22, i.e., the input voltage of the inverter 20 is at the low level (ground voltage VG), it is assumed that the inverter 20 output voltage, i.e., the input voltage Vi of the delay circuit 22 has turned from the low level to the high level (the power supply voltage VD).

Then, in the delay circuit 22, the first switch element 23a turns on and the second switch element 23b turns off as described above, which causes a current (or a charging current) to flow into the input of the inverter 20 through the first switch element 23a thereby to charge the input capacitance Cin (not shown) of the inverter 20. In this way, the output voltage Vo of the delay circuit 22 rises from the ground voltage VG to the power supply voltage VD at a rate (time constant) determined by the input capacitance Cin and the magnitude of the charging current. When the output voltage Vo exceeds the threshold value of the inverter 20, the inverter 20 output or the delay circuit 22 input voltage Vi inversely turns to the low level.

Then, in the delay circuit 22, the first switch element 23a turns off and the second switch element 23b turns on as described above. This causes a current (or a discharging current) to flow out of the input of the inverter 20 through the second switch element 23b thereby to discharge the input capacitance Cin (not shown) of the inverter 20. In this way, the output voltage Vo of the delay circuit 22 falls from the power supply voltage VD to the ground voltage VG at a rate (time constant) determined by the input capacitance Cin and the magnitude of the discharging current. When the output voltage Vo becomes below the threshold value of the inverter 20, the inverter 20 output or the delay circuit 22 input voltage Vi inversely turns to the high level.

Thereafter, the same operations are repeated to cause the output terminal To of the delay circuit 22 to output the output voltage Vo of which the frequency varies in response to the delay time due to the variable delay circuit 22.

The magnitude of the current that flows through the first switch element 23a varies in response to the first control voltage Vc1. Specifically, when the first control voltage Vc1 is at the ground voltage VG, the gate-source voltage of the first switch element 23a is the maximum, and accordingly the charging current flowing through the first switch element 23a is the maximum. As the first control voltage Vc1 approaches the power supply voltage VD, the gate-source voltage of the first switch element 23a becomes smaller, which reduces the charging current following through the first switch element 23a.

Also, the magnitude of the discharging current following through the second switch element 23b varies in response to the second control voltage Vc2. Specifically, when the second control voltage Vc2 is at the power supply voltage VD, the gate-source voltage of the second switch element 23b is the maximum, and accordingly the discharging current flowing through the second switch element 23b is the maximum. As the second control voltage Vc2 approaches the ground voltage VG, the gate-source voltage of the second switch element 23b becomes smaller, which reduces the discharging current following through the second switch element 23b.

That is, as the first control voltage Vc1 is higher and the second control voltage Vc2 is lower, it takes the more time to charge or discharge the input capacitor Cin of the inverter 20, which increases the propagation delay of a signal transferring through the variable delay circuit 22. As a result, the oscillation frequency of the voltage-controlled ring oscillator 2 lowers.

As in case of the propagation delay in inversion of the output voltage Vo of the variable delay circuit 22, the propagation delay in the inverter 20 varies in response to the input capacitor of the variable delay circuit 22 and the magnitude of either the charging current flowing through the pMOS transistor 20a or the discharging current flowing through the nMOS transistor 20b. However, the propagation delay in the inverter 20 depends only on the power supply voltage VD and the temperature without incurring affections of the first control voltage Vc1 and the second control voltage Vc2.

As described above, in the voltage-controlled ring oscillator 2 according to the invention, the frequency of the output voltage Vo can be changed by controlling the first control voltage Vc1 and the second control voltage Vc2, which causes a change in the current that charges or discharges the input capacitor of the inverter 20 in the inversion of the output voltage Vo and accordingly a change in the propagation delay of a signal transferring in the inverter 20.

Also, in the voltage-controlled ring oscillator 2, the number of the transistors connected in series between the power supply line L1 and the ground line L2 is only two, and the two transistors never turn on together. This enables the voltage-controlled ring oscillator 2 to operate with such the power supply voltage VD as can supply a gate-source voltage enough for turning on a single transistor. Thus, the power supply voltage VD can be set lower as compared with the prior art voltage-controlled ring oscillator 102.

Figure 1:
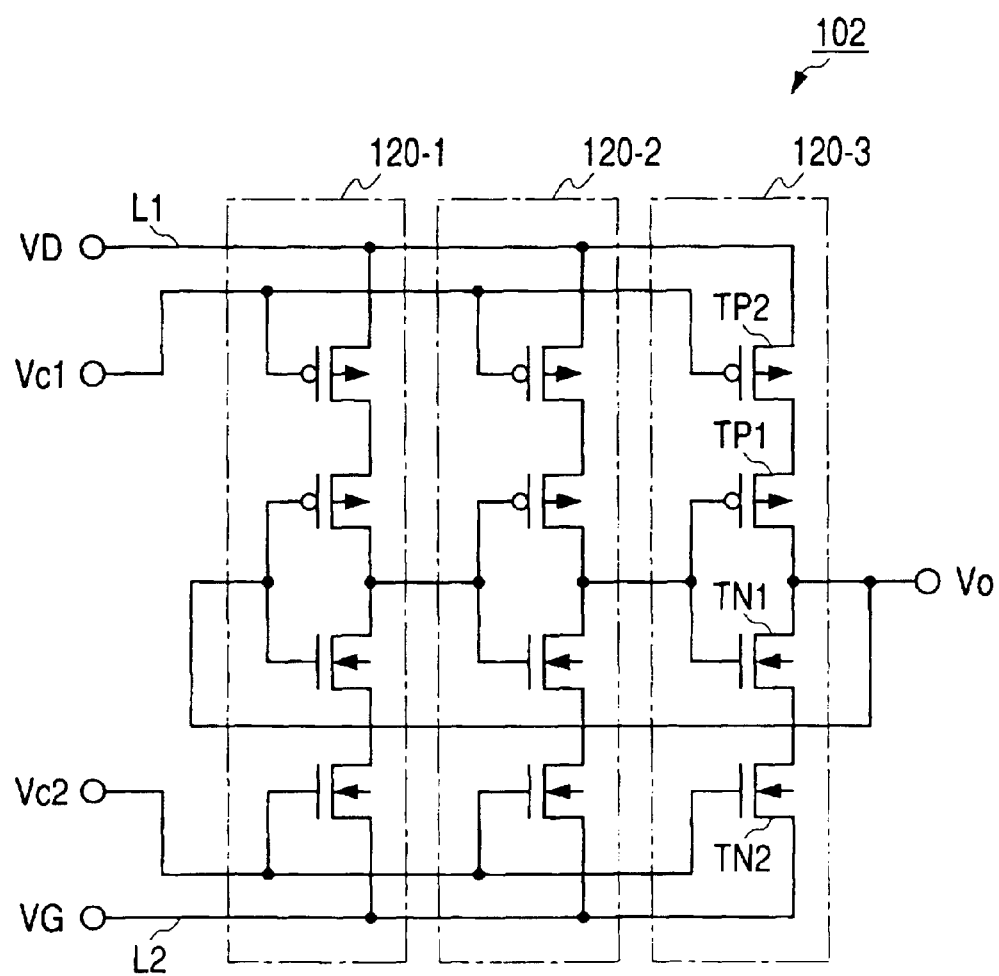
FIG. 1 is a circuit diagram of a typical differential voltage-controlled ring oscillator.
Figure 2:
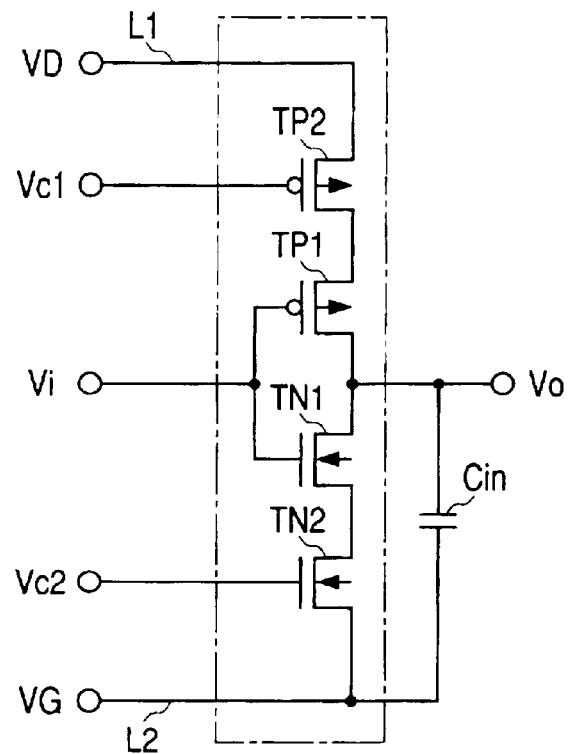
FIG. 2 is a diagram showing an equivalent circuit of a variable-delay inverter 120-$i$ of FIG. 1.
Figure 3:
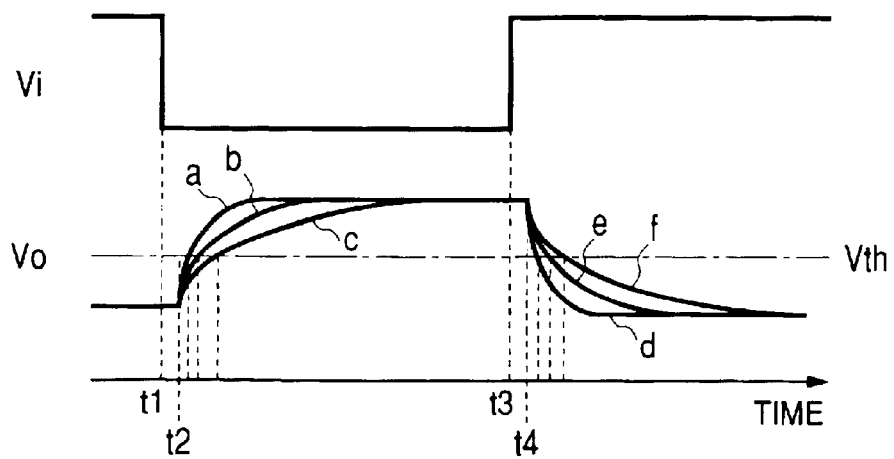
FIG. 3 is a diagram showing waveforms of the input voltage Vi and the output voltage Vo at times of the switching operations of each variable-delay inverter 120-$i$.
Figure 5:
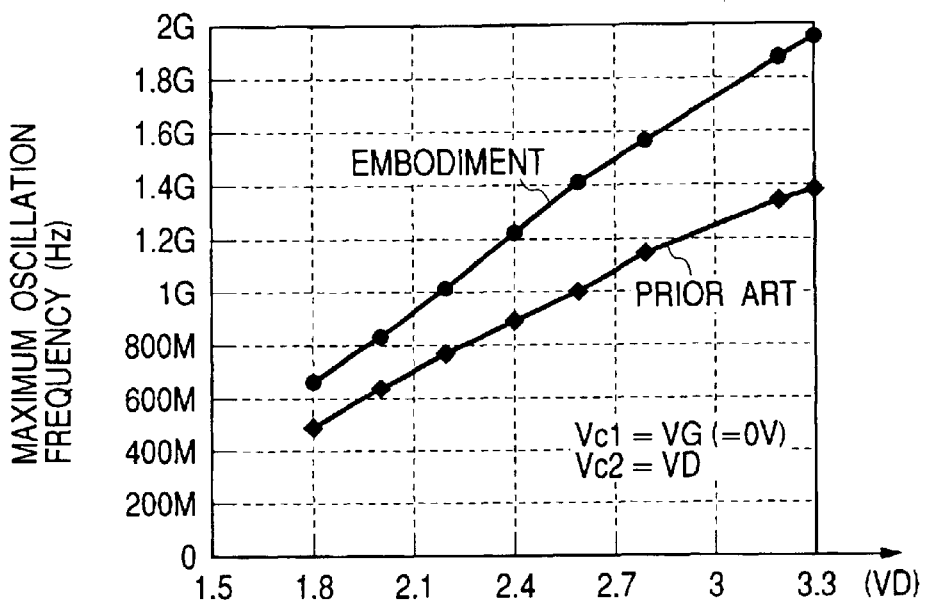
FIG. 5 is a graph showing an effect of an inventive differential voltage-controlled ring oscillator.

FIG. 5 is a graph showing, for each of the prior art voltage-controlled ring oscillator 102 of FIG. 1 and the inventive voltage-controlled ring oscillator 2 of FIG. 4, a curve of the maximum oscillation frequencies calculated for values of the power supply voltage VD through simulation. In FIG. 5, the abscissa indicates the power supply voltage VD and the ordinate indicates the maximum frequency. The term "maximum frequency" means the oscillation frequency obtained when the first control voltage Vc1 is set to the ground voltage VG and the second control voltage Vc2 is set to the power supply voltage VD.

As seen from FIG. 5, the voltage-controlled ring oscillator 2 can yield a higher frequency as compared with the prior art ring oscillator 102 if the power supply voltage VD is set constant. Also, in order to obtain a desired frequency, the voltage-controlled ring oscillator 2 can be operated with a lower power supply voltage VD as compared with the prior art ring oscillator 102.

Figure 6:
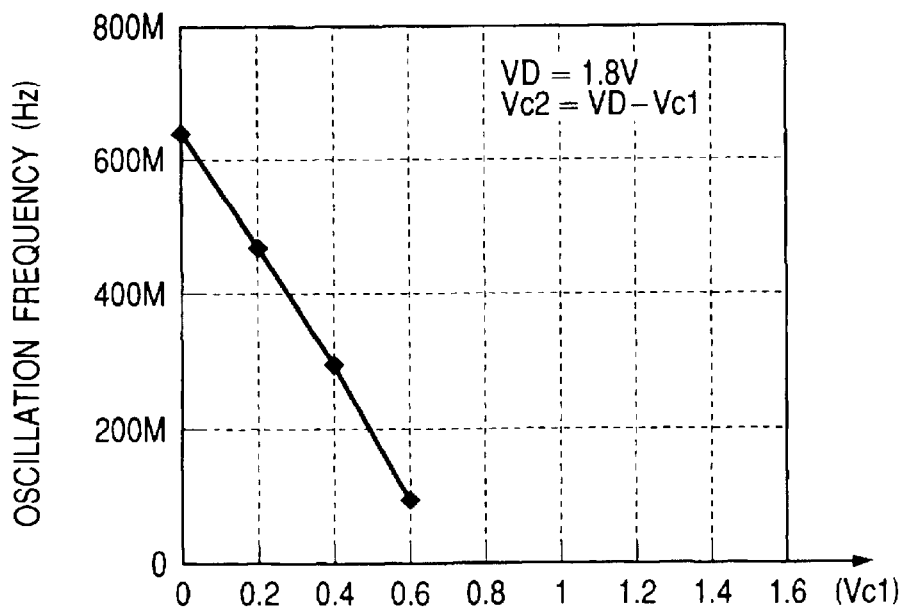
FIG. 6 is a graph showing an oscillation frequency characteristic with respect to the first control voltage Vc1.

FIG. 6 is a graph showing, for the voltage-controlled ring oscillator 2, an oscillation frequency characteristic calculated through simulation with respect to the first control voltage Vc1 in case of a constant power supply voltage VD of 1.8 V. In FIG. 6, the abscissa indicates the first control voltage Vc1 and the ordinate indicates the oscillation frequency. It is noted that the second control voltage Vc2 was set as $$Vc2=VD-Vc1,$$

such that the gate-source voltage of the first switch element 23a is equal to the gate-source voltage of the second switch element 23b.

As seen from FIG. 6, the voltage-controlled ring oscillator 2 can oscillate at a frequency up to 600 MHz even with a power supply voltage DV of 1.8 V.

According to a voltage-controlled ring oscillator of the invention, the power supply voltage VD can be lowered without the need of either lowering the thresholds of the first switch element 23a and the second switch element 23b or increasing the leak current. This enables reductions in the size and the power consumption of voltage-controlled ring oscillator. Since a lower power supply voltage VD can be used, the voltage-controlled ring oscillator 2 can be surely operated till the battery voltage lowers to the final voltage of a battery used as a power supply in portable electronic devices: e.g., 1.8–2 V in case of a lithium cell. This enables the time interval between battery exchanges or chargings.

Especially in case of the voltage-controlled ring oscillator 2, instead of the inverter 20 output, the output of the variable delay circuit 22 is used as the output of the oscillator 2, causing the loads of the oscillator 2 to be averaged, which can prevent the voltage-controlled ring oscillator 2 from being subjected to the influence of the load due to the stage (i.e., a frequency divider in case of PLL) that operates using the signal from the oscillator 2.

Specifically, the output of the inverter 20 has to drive a total of four transistors: i.e., transistors 24a and 24b constituting the off-control circuit 24 and transistors 25a and 25b constituting the current-control circuit 25, whereas the output of the variable delay circuit 22 has to drive only two transistors 20a and 20b constituting the inverter 20. Using the variable delay circuit 22 output as the oscillator 2 output is preferable in order to average the loads of the voltage-controlled ring oscillator 2.

Figure 10:
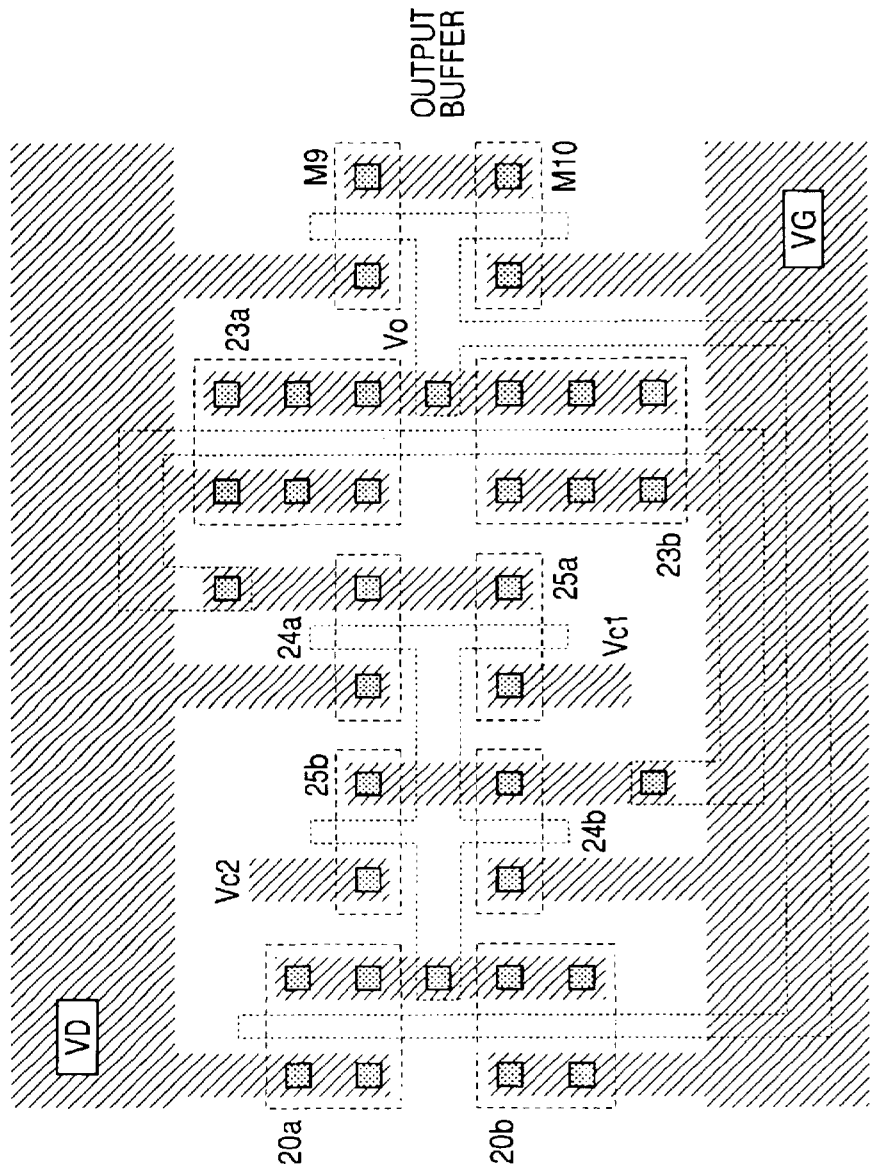
FIGS. 10 through 12 are diagrams each showing an exemplary layout of a circuit pattern formed on a semiconductor substrate.
Figure 11:
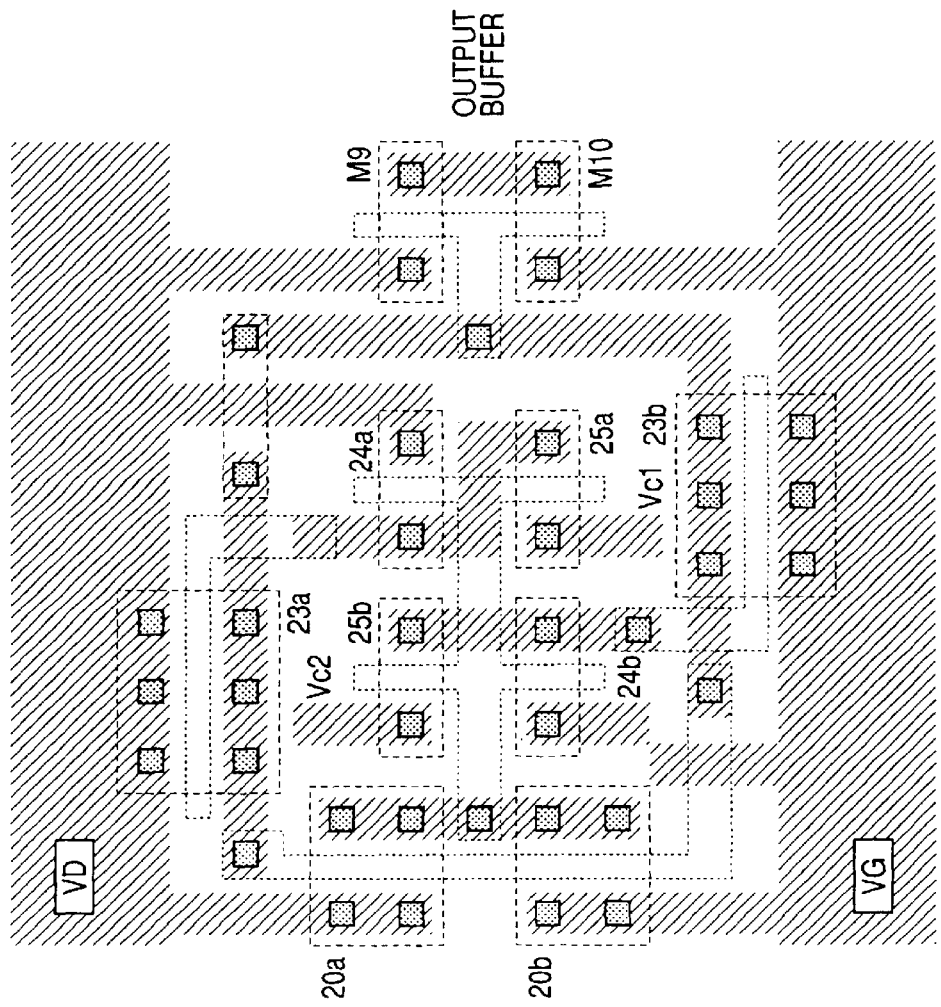
Figure 12:
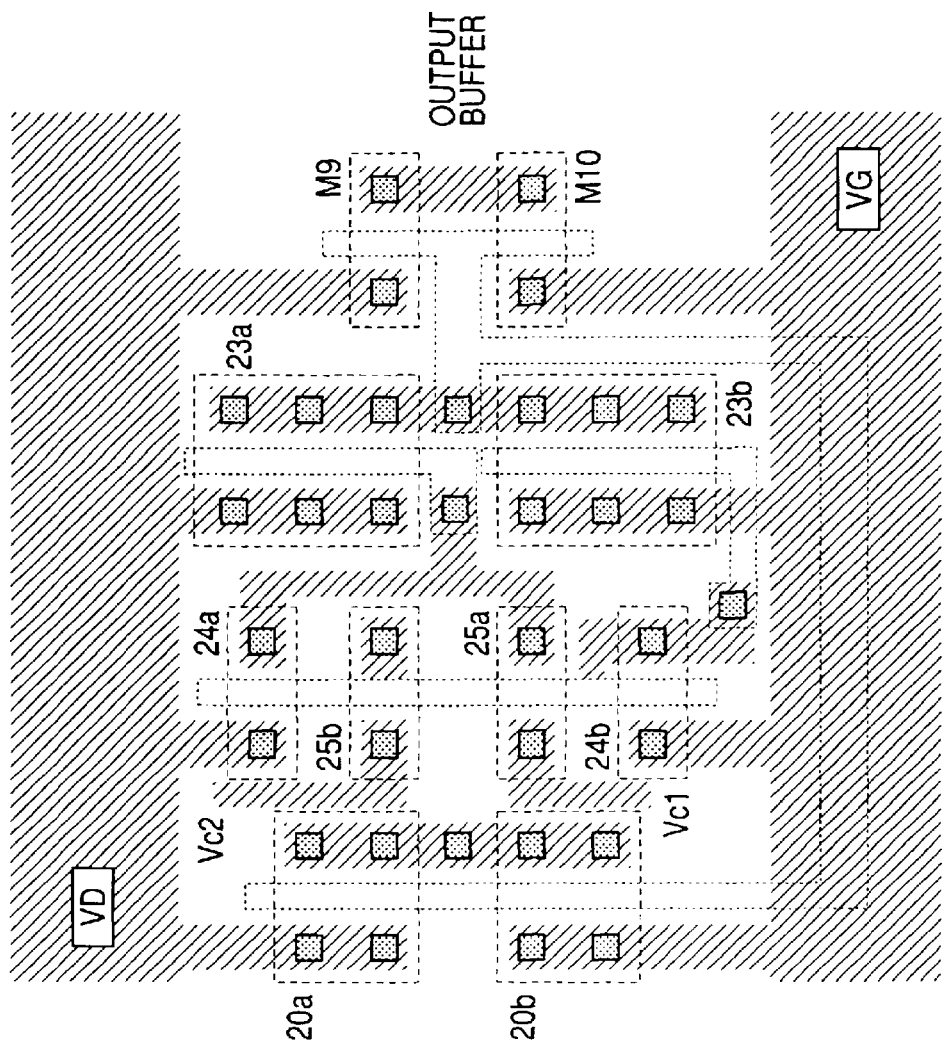
Figure 13A:
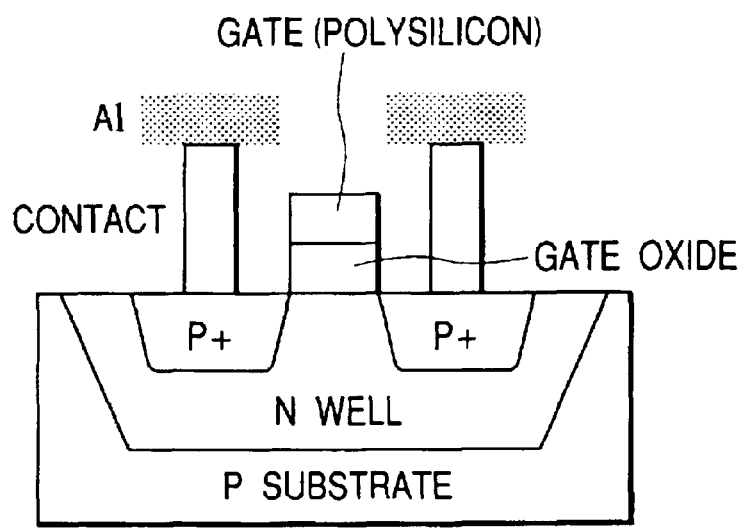
FIGS. 13A and 13B are cross sections of a p-channel transistor and an n-channel transistor, respectively.
Figure 13B:
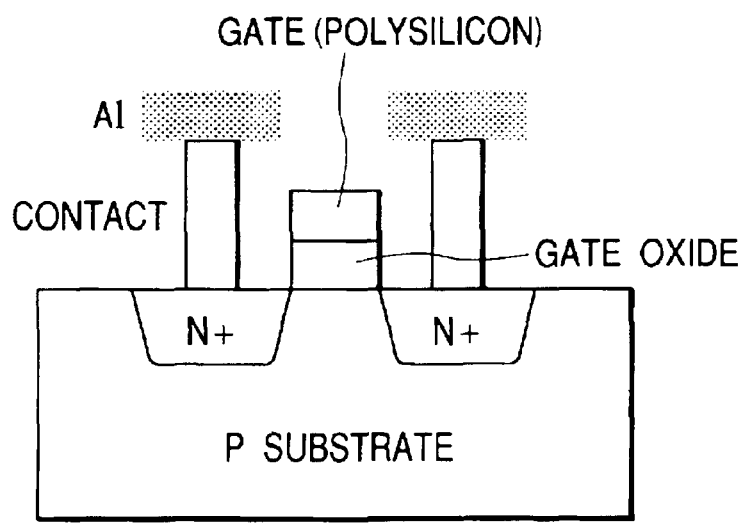

FIGS. 10 through 12 are diagrams each showing an exemplary layout of a circuit pattern formed on a semiconductor substrate for the voltage-controlled ring oscillator 2 of FIG. 4. FIGS. 13A and 13B are cross sections of a p-channel transistor and an n-channel transistor, respectively, formed on the semiconductor substrate.

In FIGS. 10 through 12, an output buffer circuit 30 comprised of a COMS inverter (transistors M9 and M10) has been added. The length of each transistor in the first direction along which the drain, the gate and the source of the transistor are disposed, which is referred to as "the transistor length", is the same, while the length of each transistor in the second direction perpendicular to the first direction, which is referred to as "the transistor width", depends on the gate width of the transistor. In FIGS. 10 through 12, the first direction is the horizontal direction, while the second direction is the vertical direction.

Matters common to the circuit patterns shown FIGS. 10 through 12 will be first described. The inverter 20, the variable delay circuit 22, and the output buffer 30 are disposed in this order from the left to the right side. The inverter 20 constituting transistors 20a and 20b are disposed vertically and the buffer 30 constituting transistors M9 and M10 are disposed vertically. Since the upper part of the circuit pattern is formed in the n well and the lower part of the circuit pattern is formed in the p well, the pMOS transistors 20a, 23a, 25a, 25b and M9 are disposed in the upper part, while the nMOS transistors 20b, 23b, 24b, 24a and M10 are disposed in the lower part. The patterns drawn with frame lines are polysilicon patterns forming gates; the patterns filled with black are aluminum (Al) wirings; and the square patterns on the drain and the source of a transistor are contacts connecting the device with an aluminum pattern. As shown in FIG. 13, the circuit pattern has a three-dimensional structure in which though shown as overlapping each other in a top view of FIGS. 10 through 12, the polysilicon patterns and the wirings never contact each other.

Now, it is assumed that the gate width of the inverter 20 constituting transistors 20a and 20b is x; the gate width of transistors 24a, 24b, 25a and 25b constituting the off-control circuit 24 and the current-control circuit 25 is y; and the gate width of the switching circuit 23 transistors 23a and 23b is z. Then, it is preferable to make the gate width ratio x:y:z substantially 2:1:3. This is because it has been found, through simulation for various gate width ratios, that the ratio 2:1:3 yields a highest-frequency oscillation.

The differences among the circuit patterns of FIGS. 10 through 12 for the variable delay circuit 22 will be described in the following.

In the layout shown in FIG. 10, transistors 23a and 23b (switching circuit 23), transistors 24a and 25a (referred to as "first block"), and transistors 24b and 25b (referred to as "second block") are vertically disposed in each pair. The switching circuit 23, the first and the second blocks are disposed in a horizontal line from the left side to the right side. Also, all transistors are formed such that drain, gate and source are vertically disposed.

In the layout shown in FIG. 11, only the arrangement of the switching circuit 23 constituting transistors 23a and 23b is different: i.e., the transistor 23b is disposed in an area under nMOS transistors 24b and 25a; and the transistor 23a is disposed in an area over pMOS transistors 24a and 25b. In other words, the switching circuit 23 constituting transistors 23a and 23b are disposed in the upper and lower areas, respectively, between which the first and second blocks are disposed. Also, as is different from other transistors, the drain, gate and source are formed in a vertical line in each of the transistors 23a and 23b.

In the layout shown in FIG. 12, only the arrangement of transistors 24a, 24b, 25a and 25b constituting the off-control circuit 24 and the current-control circuit 25 (the first and second blocks) has been changed as compared with FIG. 10. Specifically, transistors 24a, 24b, 25a and 25b are disposed in a vertical line.

That is, in layouts of FIGS. 11 and 12, the size of the semiconductor substrate in the first direction has been reduced by the length of one transistor as compared with the layout of FIG. 10. This enables a reduction in the length of a wiring pattern that feeds the output of the variable delay circuit 22 (i.e., the output of the switching circuit 23) back to the input of the inverter 20. This results in not only smaller die (semiconductor substrate) size but also a reduction in the parasitic capacitance in the wiring pattern, which prevents the oscillation frequency of the voltage-controlled ring oscillator 2 from lowering.

In the above-described embodiment, the differential voltage-controlled ring oscillator (DVCRO) 2 has been comprised of one inverter 20 and one variable delay circuit 22. However, the DVCRO 2 may be comprised of an odd number of inverters 20 and one or more variable delay circuit 22 connected in the ring form.

Also, the variable delay circuit 22 may be used not only for the DVCRO 2 but also for other applications.

Further, a variable-delay inverter may be made by simply adding an inverter 20 to the input or the output of the variable delay circuit 22.

Figure 7:
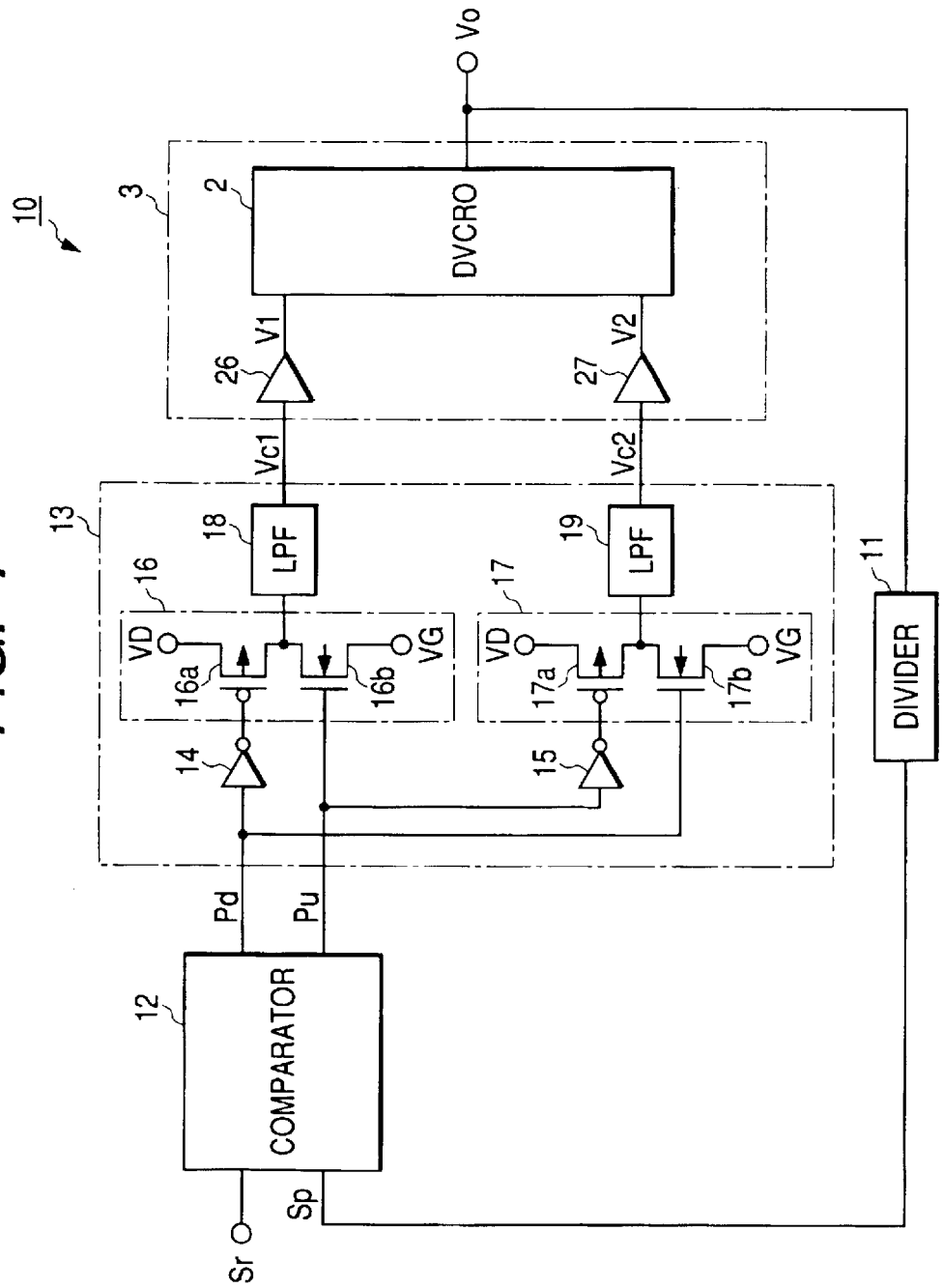
FIG. 7 is a schematic circuit diagram of a PLL incorporating an inventive differential voltage-controlled ring oscillator in accordance with another aspect of the invention.

FIG. 7 is a schematic circuit diagram showing an overall arrangement of a PLL incorporating an inventive DVCRO in accordance with another aspect of the invention. In FIG. 7, the PLL 10 comprises a DVCRO portion 3 capable of varying the oscillation frequency in response to the differential control voltages Vc1 and Vc2; a frequency divider 11 for dividing, in frequency, the output signal Vo from the DVCRO portion 3 into a divide-by-N signal Sp; a phase comparator 12 for comparing an externally input reference signal Sr with the divide-by-N signal Sp from the frequency divider 11 and putting out a first pump signal Pd that is at the high level only during a period when the divide-by-N signal Sp is ahead, in phase, of the reference signal Sr and a second pump signal Pu that is at the high level only during a period when the divide-by-N signal Sp is behind the reference signal Sr in phase; and a differential control signal generator 13 for generating differential control signals Vc1 and Vc2 on the basis of the first pump signal Pd and the second pump signal Pu.

The differential control signal generator 13 comprises inverters 14 and 15 for inverting the first Pd and second Pu pump signals, respectively; a first charge pump circuit 16 for supplying a charging current during a high level of the first pump signal Pd and drawing a discharging current during a high level of the second pump signal Pu; a second charge pump circuit 17 for drawing a discharging current during a high level of the first pump signal Pd and supplying a charging current during a high level of the second pump signal Pu; low pass filters (LPFs) 18 and 19 for filtering respective outputs of the first 16 and second 17 charge pump circuits to provide the differential control signals Vc1 and Vc2.

The first charge pump circuit 16 comprises a pMOS transistor 16a and an NMOS transistor 16b of which the drains are connected together. The power supply voltage VD is applied to the source of the pMOS transistor 16a. The ground voltage VG is applied to the source of the nMOS transistor 16b. To the pMOS transistor 16a gate, there is connected the output of the inverter 14; and the second pump signal Pu is supplied to the nMOS transistor 16b gate.

Similarly, the second charge pump circuit 17 comprises a pMOS transistor 17a and an nMOS transistor 17b of which the drains are connected together. The power supply voltage VD is applied to the pMOS transistor 17a source. The ground voltage VG is applied to the nMOS transistor 17b source. To the pMOS transistor 17a gate, there is connected the output of the inverter 15; and the first pump signal Pd is supplied to the nMOS transistor 17b gate.

Thus, when the divide-by-N signal Sp is ahead, in phase, of the reference signal Sr, the first charge pump circuit 16 charges the first LPF 18 and the second charge pump circuit 17 discharges the second LPF 19, which raises the first control voltage Vc1 and lowers the second control voltage Vc2. Conversely, when the divide-by-N signal Sp is behind the reference signal Sr in phase, the first charge pump circuit 16 discharges the first LPF 18 and the second charge pump circuit 17 charges the second LPF 19, which lowers the first control voltage Vc1 and raises the second control voltage Vc2.

The differential control voltages Vc1 and Vc2 vary in a arrange from the ground voltage VG to the power supply voltage VD and have respective magnitudes that are symmetrical with respect to the middle voltage between the ground voltage VG and the power supply voltage VD. In other words, the differential control voltages Vc1 and Vc2 vary such that the difference due to the subtraction of the first control voltage Vc1 from the power supply voltage VD is always equal to the difference due to the subtraction of the ground voltage VG from the second control voltage Vc2: i.e., VD−Vc1=Vc2−VG.

If the divide-by-N signal Sp coincides in phase with the reference signal Sr, the first 16 and second 17 pump circuits enter the high impedance state to maintain the first control voltage Vc1 and the second control voltage Vc2.

The DVCRO portion 3 comprises buffer circuits 26 and 27 according to the invention, and the above-described DVCRO 2. The differential control voltage vc1 and vc2 are supplied to the differential control voltage inputs of the DVCRO 2 through the buffer circuits 26 and 27, respectively.

Figure 8A:
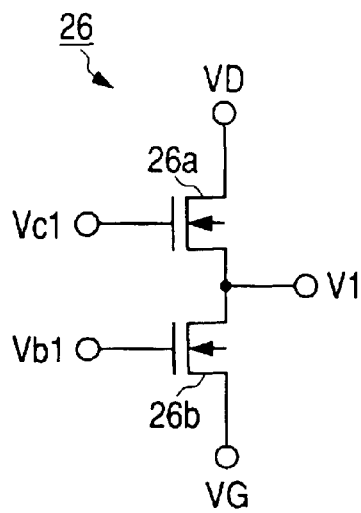
FIGS. 8A and 8B are diagrams showing exemplary arrangements of the buffer circuits 26 and 27 of FIG. 7.
Figure 8B:
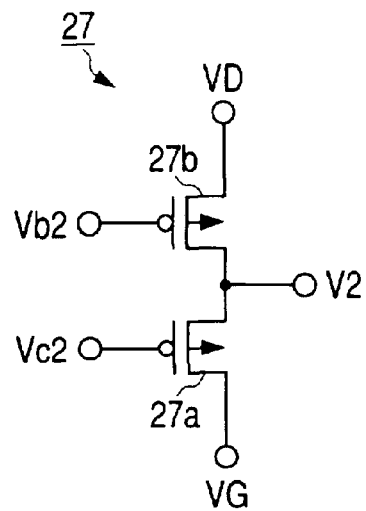

FIGS. 8A and 8B are diagrams showing exemplary arrangements of the buffer circuits 26 and 27 of FIG. 7.

In FIG. 8A, the buffer circuits 26 comprises two nMOS transistors 26a and 26b. The nMOS transistor 26a has its drain connected to the power supply voltage VD, its gate connected to the LPF 18 output, and its source connected to the drain of the nMOS transistor 26b. The source-drain node serves as the output V1 of the buffer circuit 26. The nMOS transistor 26b has its source connected to the ground voltage VG and a constant bias voltage Vb1 applied to its gate.

In FIG. 8B, the buffer circuits 27 comprises two pMOS transistors 27a and 27b. The pMOS transistor 27a has its drain connected to the ground voltage VG, its gate connected to the LPF 19 output, and its source connected to the drain of the pMOS transistor 27b. The source-drain node serves as the output V2 of the buffer circuit 27. The pMOS transistor 27b has its source connected to the power supply voltage VD and a constant bias voltage Vb2 applied to its gate.

It is noted that the constant bias voltages Vb1 and Vb2 is set to respective values that surely turn on the transistors 26b and 27b. Each of the buffer circuits 26 and 27 constitutes a source follower circuit that has a high input impedance and an amplification factor less than 1.

Figure 9:
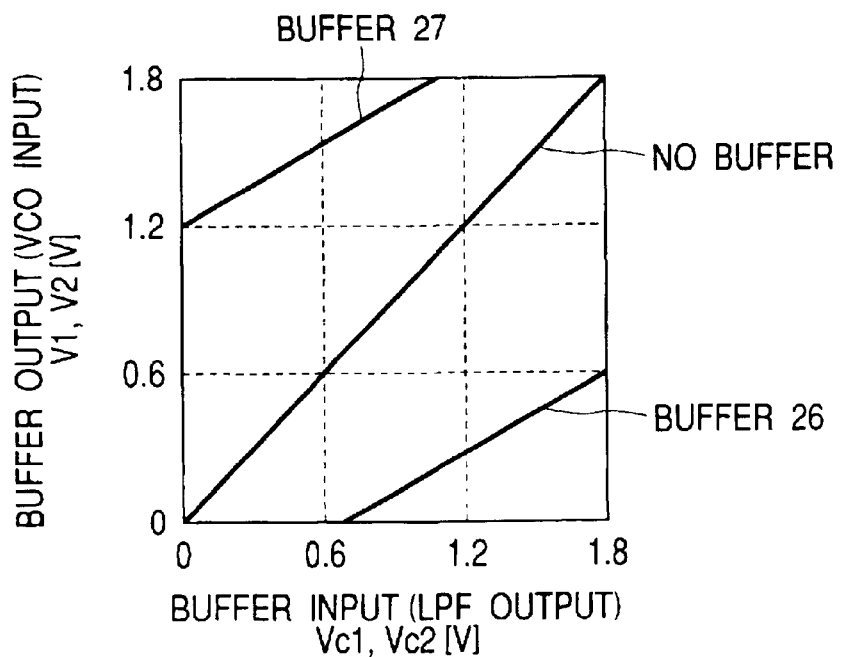
FIG. 9 is a graph showing input-output characteristics of the buffer circuits 26 and 27.

FIG. 9 is a graph showing input-output characteristics of the buffer circuits 26 and 27. In FIG. 9, the abscissa indicates the buffer input voltage Vc1 or Vc2 and the ordinate indicates the buffer output voltage V1 or V2, respectively.

If the first control voltage Vc1 is so low as to cause the gate-source voltage of transistor 26a to be under the threshold value (about 0.7 V in this specific example) of transistor 26a, then the output V1 of the buffer 26 is at the ground voltage VG. If the first control voltage Vc1 (0.7~VD [V]) is higher than such a value as cause the gate-source voltage of transistor 26a to be over the threshold value of transistor 26a, then the output V1 of the buffer 26 is proportional to the first control voltage Vc1. However, the gradient of the graph is less than 1.

Similarly, if the second control voltage Vc2 is so low as to cause the gate-source voltage of transistor 27a to be under the threshold value (about 0.7 V in this specific example) of transistor 27a, then the output V2 of the buffer 27 is at the power supply voltage VD. If the second control voltage Vc2 (0~VD-0.7 [V]) is higher than such a value as cause the gate-source voltage of transistor 27a to be over the threshold value of transistor 27a, then the output V2 of the buffer 27 is proportional to the second control voltage Vc2. However, the gradient of the graph is less than 1.

It is noted that in FIG. 9, it is assumed that the power supply voltage VD is 1.8 V. Properly adjusting the amplification factors of the buffers 26 and 27 through the bias voltage Vb1 and Vb2 causes the buffers 26 and 27 to convert the first control voltage Vc1 and the second control voltage Vc2 that varies in a range (0~1.8 V in this specific example) from the ground voltage VG to the ground voltage VG into signal V1 variable in a first range from 0 to 0.6 V and signal V2 variable in a second range from 1.2 to 1.8 V, respectively. The first and the second ranges never cause the DVCRO 2 to stop oscillation.

As described above, since the inventive PLL 10 uses the DVCRO 2 according to the invention, in order to obtain a desired frequency, the PLL 10 can be operated with a lower power supply voltage VD as compared with the prior art. Also, the PLL 10 can yield a higher frequency as compared with the prior art if the power supply voltage VD is set constant.

Further, according to the invention, a PLL 10 can be realized as one or more integrated circuit that operate(s) with a lower power supply voltage, which enables reductions in the size and the power consumption of the PLL.

Since a lower power supply voltage VD can be used, the inventive PLL 10 can be surely operated till the battery voltage lowers to the final voltage of a battery used as a power supply in portable electronic devices: e.g., 1.8–2 V in case of a lithium cell. This enables the time interval between battery exchanges or chargings.

The inventive PLL 10 is provided with the buffers 26 and 26 so as to prevent the DVCRO 2 from stopping oscillation, which enables the oscillation frequency of the DVCRO 2 to converge rapidly on a desired frequency.

Since the amplification factors of the buffers 26 and 27 is less than 1, the ratio of an oscillation frequency change with respect to changes of the differential control voltages Vc1 and Vc2 is small. This enables the reduction in the variation of the oscillation frequency due to noise.

Also, the buffers 26 and 27 can be easily realized by a source follower circuit that has an amplification factor smaller than 1 and a high input impedance, which prevents the charges stored in the LPFs 18 and 19 to be dissipated. This enables the buffers 26 and 27 to constantly supply the DVCRO 2 with the differential control voltages Vc1 and Vc2 precisely corresponding to the phase difference detected by the phase comparator 12.

In the above-described PLL 10, the first control voltage Vc1 and the second control voltage Vc2 are generated by using individually provided charge pump circuits 16 and 17 and LPFs 18 and 19. However, one of the control voltages may be generated by using a single set of a charge pump circuit and an LPF; and the other control voltage may be generated from the generated control voltage by using an inverting amplifier with an amplification factor of 1.

In the above-described embodiment, each of the buffers 26 and 27 has had an operational range in which the output voltage V1 or V2 remains unchanged for the input voltage Vc1 or Vc2. Alternatively, by using an amplifier with an amplification factor smaller than 1, an arrangement may be made so as to convert a control voltage variable from the ground voltage VG to the power supply voltage VD into such an output voltage as never cause the DVCRO 2 to stop oscillation.

Many widely different embodiments of the present invention may be constructed without departing from the spirit and scope of the present invention. It should be understood that the present invention is not limited to the specific embodiments described in the specification, except as defined in the appended claims.

What is claimed is:

1. A variable delay circuit for providing a delayed version of an input signal, the variable delay circuit being to be connected to an input of a load which input has a capacitance, the variable delay circuit comprising;

an input terminal to which said input signal is applied;

an output terminal to be connected to said input of said load;

first and second control terminals to which first and second control signals that determine the amount of delay are applied;

a switching circuit including:
a first switching element comprising a p-channel MOS transistor having its drain connected to said output terminal and its source connected to a higher power supply conductor; and
a second switching element comprising an n-channel MOS transistor having its drain connected to said output terminal and its source connected to a lower power supply conductor, an off control circuit, responsive to said input signal, for turning off one of said first and second switching elements by shorting a gate-source path of said one switching element; and a current control circuit, responsive to an off state of said second switching element, for causing said first control signal to control a first current flowing through said first switching element by providing a conductive path between said first control terminal and a gate of said first switching element, and responsive to an off state of said first switching element, for causing said second control signal to control a second current flowing through said second switching element by providing a conductive path between said second control terminal and a gate of said second switching element.

2. A variable delay circuit as defined in claim 1, wherein said off control circuit includes:
a first off control element comprising a p-channel MOS transistor having its source connected to said first switching element source, its drain connected to said first switching element gate, and its gate connected to said input terminal; and
a second off control element comprising an n-channel MOS transistor having its source connected to said second switching element source, its drain connected to said second switching element gate, and its gate connected to said input terminal.

3. A variable delay circuit as defined in claim 1, wherein said current control circuit includes:
a first current control element comprising an n-channel MOS transistor having its source and drain connected to said first switching element gate and said first control terminal and its gate connected to said input terminal; and
a second current control element comprising a p-channel MOS transistor having its source and drain connected to said second switching element gate and said second control terminal and its gate connected to said input terminal.

4. A variable delay circuit as defined in claim 1, wherein said off control circuit includes:
a first off control element comprising a p-channel MOS transistor having its source connected to said first switching element source, its drain connected to said first switching element gate, and its gate connected to said input terminal; and
a second off control element comprising an n-channel MOS transistor having its source connected to said second switching element source, its drain connected to said second switching element gate, and its gate connected to said input terminal, and wherein said current control circuit includes:
a first current control element comprising an n-channel MOS transistor having its source and drain connected to said first switching element gate and said first control terminal and its gate connected to said input terminal; and
a second current control element comprising a p-channel MOS transistor having its source and drain connected to said second switching element gate and said second control terminal and its gate connected to said input terminal.

5. An integrated circuit including said load and the variable delay circuit as defined in claim 4, wherein said load and the variable delay circuit are disposed along a first direction, wherein along said first direction, there are disposed:
a first block in which said first off control element and said first current control element are disposed along a second direction perpendicular to said first direction; and
a second block in which said second off control element and said second current control element are disposed along said second direction, and wherein
said first and second switching elements are disposed in respective areas, lying along said second direction, between which said first block and said second block are disposed.

6. An integrated circuit including said load and the variable delay circuit as defined in claim 4, wherein said load and the variable delay circuit are disposed along a first direction, wherein along said first direction, there are disposed:
a control block in which said first and second off control elements and said first and second current control elements are disposed in a line along a second direction perpendicular to said first direction; and
a switch block in which said first and second switching elements are disposed along said second direction.

7. A voltage-controlled ring oscillator including:
a variable delay circuit as defined in claim 1; and
said load comprising an odd number of inverter circuits, an output of said load being connected to said input terminal, wherein the voltage-controlled ring oscillator oscillates at a frequency responsive to said first and second control signals.

8. A voltage-controlled ring oscillator including:

a variable delay circuit as defined in claim 2; and said load comprising an odd number of inverter circuits, an output of said load being connected to said input terminal, wherein the voltage-controlled ring oscillator oscillates at a frequency responsive to said first and second control signals.

9. A voltage-controlled ring oscillator including:

a variable delay circuit as defined in claim 3; and said load comprising an odd number of inverter circuits, an output of said load being connected to said input terminal, wherein the voltage-controlled ring oscillator oscillates at a frequency responsive to said first and second control signals.

10. A voltage-controlled ring oscillator as defined claim 7, wherein each inverter circuit comprises a CMOS inverter.

11. A voltage-controlled ring oscillator as defined claim 7, wherein said output terminal is used as an output terminal of the voltage-controlled ring oscillator.

12. A voltage-controlled ring oscillator as defined claim 7, further including:

a voltage converter, provided just after each of said first and second control terminals, for converting a level of an input control signal into such a signal level as never cause the voltage-controlled ring oscillator to stop oscillation.

13. A voltage-controlled ring oscillator as defined claim 12, wherein said voltage converter has a higher input impedance.

14. A voltage-controlled ring oscillator as defined claim 13, wherein a gain between an input and an output of said voltage converter is below 1.

15. A voltage-controlled ring oscillator as defined claim 12, wherein said voltage converter comprises a source follower circuit.

16. A phase locked loop circuit comprising:

a voltage-controlled ring oscillator as defined claim 7; and a control circuit for generating said first and second control signals on the basis of a phase difference between a reference signal given from external and a divide-by-N signal into which an output signal from the voltage-controlled ring oscillator is divided by N, where N is an integer including 1.

17. A phase locked loop circuit as defined in claim 16, wherein magnitudes of said first and second control signals are symmetrical with respect to a middle voltage between a higher power supply voltage and a lower power supply voltage.

18. A phase locked loop circuit as defined claim 16, wherein said control circuit comprises:

a phase comparator for providing a first phase difference signal if said divide-by-N signal is ahead, in phase, of said reference signal and providing a second phase difference signal if said divide-by-N signal is behind said reference signal in phase;

a first charge pump circuit for generating said first control signal by performing a charging operation in response to said first phase difference signal and by performing a discharging operation in response to said second phase difference signal; and a second charge pump circuit for generating said second control signal by performing a discharging operation in response to said first phase difference signal and by performing a charging operation in response to said second phase difference signal.

* * * * *